United States Patent
Eckert et al.

(10) Patent No.: US 6,525,604 B2
(45) Date of Patent: Feb. 25, 2003

(54) AMPLITUDE LIMITING METHOD FOR A DIFFERENTIAL AMPLIFIER

(75) Inventors: Juergen Eckert, Neckarsulm (DE); Juergen Schnabel, Leingarten (DE)

(73) Assignee: ATMEL Germany GmbH, Heilbronn (DE)

( * ) Notice: Subject to any disclaimer, the term of this patent is extended or adjusted under 35 U.S.C. 154(b) by 0 days.

(21) Appl. No.: 10/109,609

(22) Filed: Mar. 27, 2002

(65) Prior Publication Data

US 2002/0140505 A1 Oct. 3, 2002

(30) Foreign Application Priority Data

Mar. 27, 2001 (DE) .......................................... 101 15 099

(51) Int. Cl.[7] .............................. H03F 3/45; H03F 1/14; H03F 1/36; G01R 19/00
(52) U.S. Cl. ................................ 330/69; 330/2; 330/51; 330/85
(58) Field of Search ............................... 330/2, 51, 69, 330/85

(56) References Cited

U.S. PATENT DOCUMENTS

| | | | |
|---|---|---|---|
| 3,772,604 A | * 11/1973 | Hogg et al. ................. | 327/180 |
| 3,838,347 A | * 9/1974 | Lauffer ........................ | 235/435 |
| 4,977,378 A | 12/1990 | Tero | |
| 5,157,347 A | * 10/1992 | Geerdink et al. ............ | 330/104 |
| 5,952,883 A | * 9/1999 | Masuta ................ | 250/214 AG |
| 5,973,561 A | 10/1999 | Heaton | |

OTHER PUBLICATIONS

Publication by Jacob Millmann and Armin Gabel, "Precision Limiting, 2nd Edition", 16–15 Precision AC/DC Converters, p. 763.
Publication by Dieter Nuehrmann "Das Grosse Werkbuch Elektronik", 7th Edition, ISBN3-7723-6547-7, 1998, Franzis' Verlag GmbH, pp. 1905 to 1909.

* cited by examiner

*Primary Examiner*—Patricia Nguyen
(74) *Attorney, Agent, or Firm*—W. F. Fasse; W. G. Fasse

(57) ABSTRACT

A control unit and two negative feedback branches limit the amplitudes of the output signal of an inverting differential amplifier. Each feedback branch includes a threshold value switch including a transistor as well as an adjustable current source and a resistor forming a voltage divider between a supply voltage and the amplifier output. The voltage divider output is connected to the transistor's base. The transistor selectively connects or disconnects the input of the amplifier with either the supply voltage or the amplifier output. The control unit controls the two current sources based on external programming commands, to establish two adjustable threshold values within which the negative and positive amplitudes of the output signal are limited, symmetrically or independently, in a hard or soft clipping manner. Even with small supply voltages, the limited output will not overdrive subsequent amplifier input stages and will not superimpose harmonics on the useful signal.

20 Claims, 2 Drawing Sheets

AMPLITUDE LIMITING METHOD FOR A DIFFERENTIAL AMPLIFIER

PRIORITY CLAIM

This application is based on and claims the priority under 35 U.S.C. §119 of German Patent Application 101 15 099.7, filed on Mar. 27, 2001, the entire disclosure of which is incorporated herein by reference.

1. Field of the Invention

The present invention relates to a method and a circuit arrangement for limiting the amplitude of an output signal of an inverting differential amplifier using two threshold value switches.

2. Background Information

In order to reduce the power consumption of integrated circuits, such circuits are being operated using ever smaller supply voltages. In this context, in the field of signal processing, the amplitude level is also being ever further limited. For example, in the field of wireless communication, since several signal stages are connected one after another in a circuit, the amplification of each individual stage may not become too great, so as not to overdrive or overload the signal input of the next successive amplifier stage. Therefore, it is necessary to limit the amplitudes of the output signals of the amplifier stages, also in connection with small voltages, which may even be below a typical diode voltage, for example. Simultaneously, the measures provided for limiting the amplitude should only slightly, if at all, increase the power consumption and shall not influence the other signal stages. An important field of application of such signal processing amplifier stages is the field of mobile and cellular telephones.

In conventional known methods, the amplitudes of an output signal are limited by means of a fixedly set negative or reverse feedback threshold. Examples of such conventional circuits and methods are represented in the publication by Jacob Millmann and Armin Gabel, "Precision Limiting, $2^{nd}$ Edition", page 763, and in the publication by Dieter Nuehrmann "Das Grosse Werkbuch Elektronik", $7^{th}$ Edition, pages 1905 to 1909, whereby the amplitude limitation is only carried out for negative amplitudes above voltages of one volt.

A disadvantage of the previously known methods is that the level of the amplitude limitation is prescribed and established in a fixed manner during the process of fabricating the integrated circuit. Thus, the level of the amplitude limitation is not changeable by the end user with a reasonable or acceptable effort. Moreover, the amplitude cannot be limited for small signal voltages that are below a typical diode voltage, without loading the signal output in a low-resistance manner. Furthermore, in the conventional methods and circuit arrangements, the amplitude limitation is not symmetrically adjustable.

SUMMARY OF THE INVENTION

In view of the above, it is an object of the present invention to provide a method in which both the positive and negative amplitudes of an output signal of an amplifier can be limited, in an adjustable manner, even at voltages below 1 volt. It is another object of the invention to provide a circuit arrangement for carrying out such a method, which may be simply and economically fabricated. The invention further aims to avoid or overcome the disadvantages of the prior art, and to achieve additional advantages, as apparent from the present specification.

The above objects have been achieved according to the invention in a method for limiting an amplitude of an output signal of an inverting differential amplifier, using two threshold value switches and a control unit. Especially according to the invention, the method includes the following features. The negative amplitude of the output signal is limited so as not to range below a first threshold value by means of a first threshold value switch, which is arranged in a first negative or reverse feedback branch of the differential amplifier. The positive amplitude of the output signal is limited so as not to range above a second threshold value by means of a second threshold value switch, which is arranged in a second negative or reverse feedback branch of the differential amplifier. The two threshold values are adjusted or set by means of a control signal of the control unit.

The above objects have further been achieved according to the invention in a circuit arrangement with a control unit and a differential amplifier having first and second negative feedback branches or loops for limiting the positive and negative amplitudes of the output signal. According to the invention, the circuit arrangement includes the following features. A respective threshold value switch is provided in each one of the two negative feedback branches. Each respective threshold value switch comprises an adjustable current source, a resistor, and a transistor. In each threshold value switch, the adjustable current source is connected to a respective supply voltage, the resistor is connected to the output of the differential amplifier, and the adjustable current source and the resistor are connected in series with each other so as to form a voltage divider. The output of this voltage divider between the current source and the resistor is connected with the control input terminal of the transistor, e.g. the base of a bipolar transistor or the gate of a field effect transistor. In one embodiment, the transistor selectively connects or disconnects the input of the differential amplifier with the supply voltage, while in another embodiment, the transistor selectively connects or disconnects the input of the differential amplifier with the output of the differential amplifier. The adjustable current source is connected with the control unit, which is further connected to a signal line for the transmission of programming commands.

The basic concept of the invention is to limit an output signal of an inverting differential amplifier in a high-resistance manner, in that the positive amplitude of the output signal is limited so as not to range above a first threshold value by a first threshold value switch in a first negative feedback branch of the inverting differential amplifier, while the negative amplitude of the output signal is limited so as not to range below a second threshold value by a second threshold value switch in a second negative feedback branch of the differential amplifier, whereby the two threshold value switches can be adjusted by means of a control signal from a programmable control unit. In order to provide the threshold values used for the amplitude limiting, by means of a simple circuit arrangement, it is advantageous if the inverting differential amplifier and the two threshold value switches are respectively supplied with a symmetrical supply voltage. It is further advantageous if the two threshold values have the same magnitude, in order to thereby ensure a symmetrical limitation of the amplitudes. This further prevents any possible falsifications, i.e. alterations or corruptions due to non-symmetrical clipping of the signal form in the signal processing.

According to a further embodiment feature of the method of the invention, the two threshold values in the two threshold value switches are generated by means of two controllable current sources. Since the current sources are very high resistance elements, a threshold value generated in this manner is only minimally dependent on a variation in the supply voltage. The current source is further connected with a resistor to form a voltage divider, so that variable and selectable voltage values can be adjusted at the output of the voltage divider, depending on the level of the supplied current. In an advantageous manner, these voltage values can be applied to the control input terminal, e.g. the base, of a transistor, which is arranged in common with the respective resistor in the respective negative feedback branch, for example, in order to thereby provide an offset voltage by means of which very small threshold values can be set for the amplitude limitation. Thereby, depending on the magnitude and direction of the current being supplied or injected by the respective current source, merely a small voltage at the signal output of the differential amplifier is sufficient in order to limit the positive and negative amplitudes of the output signal. It is especially advantageous if the transistor arranged in the negative feedback branch is connected between the output signal line and the input signal line of the amplifier. Thereby, especially in connection with pulse-form input signals, an interspersal over the supply voltage in the subsequent signal stages is prevented.

In a different further embodiment of the inventive method, the two controllable current sources are, for example, respectively embodied as complementary current mirrors, and are coupled with one another by means of a coupling element, for example a coupling transistor. In this regard, a reference current generated by a control unit is reflected or coupled by means of the coupling transistor from the first current mirror to the second current mirror. Thereby, both threshold values are simultaneously adjusted and set in common with one another using a single control signal, whereby the two threshold values exhibit a comparable temperature variation or dependence. Thus, the adjusted or selected symmetry in the limitation of the amplitudes of the output signal on the positive side and on the negative side will only be slightly, if at all, influenced by temperature variations.

In yet another different embodiment feature of the inventive method, it is advantageous to apply a reference voltage to the non-inverting input of the differential amplifier, whereby this reference voltage is derived from the average of the voltage of the input signal. Thereby, an amplification of direct (DC) voltage offsets of the input signal is reliably suppressed, which is advantageous, because this would otherwise lead quickly to an unsymmetrical limitation of the output signal.

Experiments and investigations conducted by the applicants have shown that the inventive method may especially advantageously be utilized for limiting the amplitude of the output signal of the differential amplifier in a "soft" manner, i.e. by so-called "soft-clipping". Through such a soft application of the amplitude limitation, no interfering harmonics will be added to the output signal, which would otherwise very drastically interfere with the useful signal in view of the low amplitude levels.

BRIEF DESCRIPTION OF THE DRAWINGS

In order that the invention may be clearly understood, it will now be described in connection with example embodiments, with reference to the accompanying drawings, wherein.

DETAILED DESCRIPTION OF PREFERRED EXAMPLE EMBODIMENTS AND OF THE BEST MODE OF THE INVENTION

Figure 1:
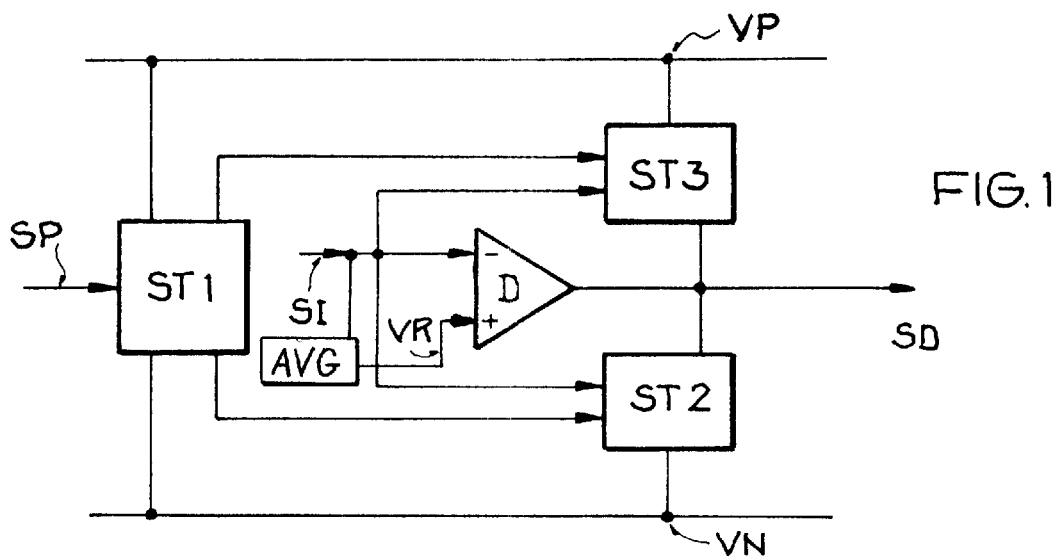
FIG. 1 is a schematic block diagram of a first example embodiment of a circuit for carrying out the inventive amplitude limiting method for an inverting differential amplifier by means of two adjustable threshold value switches.
Figure 2:
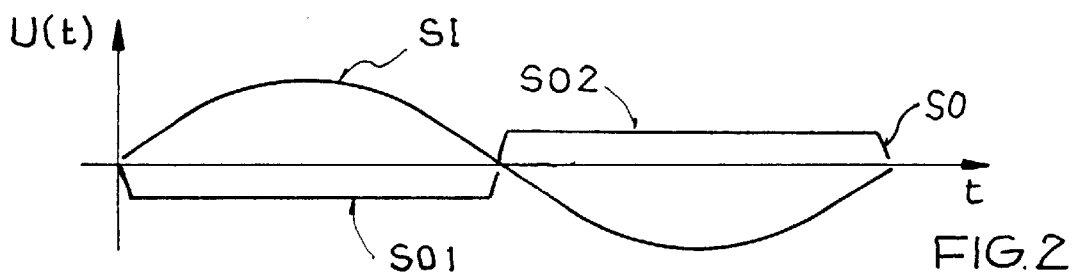
FIG. 2 shows the time progression or characteristic of the signal voltage at the input and the output of the differential amplifier according to FIG. 1.

FIG. 1 schematically shows an inverting differential amplifier, which generally has the purpose of carrying out an amplitude limitation for negative and positive output voltages. This amplitude limitation is, for example, necessary in the signal processing for wireless communications, in order to avoid over-loading or over-driving the successive or following amplifier stages. An example of the inverted and limited output signal SO of the differential amplifier in connection with and dependent on an input signal SI is shown in FIG. 2.

The following discussion will explain in detail the structure of a circuit arrangement that generally includes a differential amplifier D, a first threshold value switch ST2, a second threshold value switch ST3, and a control unit ST1. The differential amplifier D is respectively connected with a negative supply voltage VN and a positive supply voltage VP (for the sake of simplicity, the power supply connections to the differential amplifier D are not shown). An input signal SI is applied to the inverting input (−) of the differential amplifier D. Furthermore, a reference voltage VR is applied to the non-inverting input (+) of the differential amplifier D, whereby the magnitude of this reference voltage VR is derived as the average or mean value of the applied input signal SI through an averaging element AVG.

An output signal SO is generated at the output of the differential amplifier D, and is fed back to the inverting input of the differential amplifier D, respectively through two negative or reverse feedback branches or loops. The first negative feedback branch includes a first threshold value switch ST2, which is connected with the negative supply voltage VN and comprises a control input that is connected with the control unit ST1. The second negative feedback branch includes a second threshold value switch ST3 which is connected with the positive supply voltage VP and comprises a control input that is connected with the control unit ST1. The control unit ST1 is connected with the negative supply voltage VN and the positive supply voltage VP, and comprises an input to which is applied a programming signal SP via a suitable signal conductor.

The functional operation of the above described circuit will now be described in connection with the voltage curves as a function of time shown in FIG. 2. The amplitude of the input signal SI applied to the inverting input of the differential amplifier D is inverted and amplified to generate the output signal SO at the output of the differential amplifier D. Thereby the magnitude of the amplification of the negative and positive amplitudes is respectively determined by the threshold value switches ST2 and ST3. If the negative amplitude of the output signal SO exceeds a pre-set threshold value SO1 in magnitude (i.e. falls negatively below the negative threshold value SO1), then this amplitude of the output signal will be limited or clipped by the threshold value switch ST2. Correspondingly, the maximum amplitude of the positive side of the output signal SO will be limited or clipped so as not to exceed (or range above) a pre-set threshold value SO2 by means of the threshold value switch ST3. Thereby, the level or magnitude of the thresholds as well as the gain of the amplification will be determined by the control unit ST1, which is adjustable within the range prescribed by the magnitude of the supply voltage, by means of the programming signal SP provided to the control unit ST1.

Figure 3:
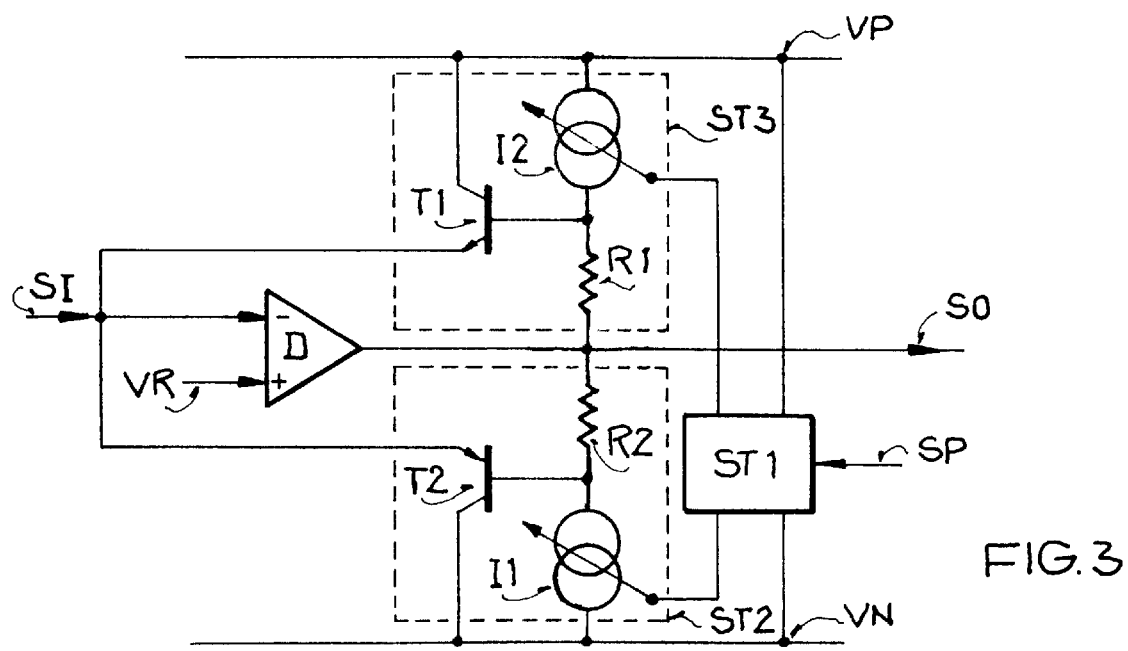
FIG. 3 is a schematic block circuit diagram of an example circuit arrangement for the amplitude limitation by means of controllable current sources as adjustable threshold value switches.

The purpose of the particular circuit arrangement embodiment shown in FIG. 3 is to carry out a hard amplitude limitation for small amplitudes of the output signal SO of the differential amplifier D. As a further detail beyond the general schematic shown in FIG. 1, FIG. 3 illustrates an example embodiment of the construction of the threshold value switches ST2 and ST3, which will now be described in detail.

The threshold value switch ST2 arranged in the first negative feedback branch comprises a voltage divider that is formed by a high-resistance resistor R2 connected with the output of the differential amplifier D, and a controllable current source I1 connected with the negative supply voltage VN. The threshold value switch ST2 further includes a transistor T2, of which the base (i.e. the control terminal) is connected to the output of the voltage divider, i.e. between the current source I1 and the resistor R2. Furthermore, the emitter (i.e. one of the controlled terminals) of the transistor T2 is connected with the inverting input of the differential amplifier D, and the collector (i.e. the other of the controlled terminals) of the transistor T2 is connected with the negative supply voltage VN.

Similarly to the first threshold value switch ST2, the second threshold value switch ST3 arranged in the second negative feedback branch comprises a voltage divider that consists of a high-resistance resistor R1 connected with the output of the differential amplifier D, and a controllable current source I2 connected with the positive supply voltage VP. The second threshold value switch ST3 further comprises a transistor T2, having a base connected to the output of the second voltage divider, a collector connected with the positive supply voltage VP and an emitter connected with the inverting input of the differential amplifier D.

The functional operation of the circuit of FIG. 3 will now be described in detail. Responsive and corresponding to the control signals prescribed by the control unit ST1, the magnitudes of the respective voltage drops across the resistors R2 and R1 are adjusted and set by means of the associated magnitudes of the currents being supplied by the current sources I1 and I2. In the event that the magnitude of the voltage drop across the respective resistors exceeds the magnitude of the base-emitter voltage of the transistors T2 or T1, then the respective transistors will become conductive and the amplitude of the output signal SO will correspondingly be limited in a hard clipped fashion.

Thereby, the voltage drop respectively set by means of the two current sources I1 and I2 acts as an offset voltage, that is to say the maximum magnitude of the amplitude of approximately 0.7 volts (base-emitter voltage) is correspondingly reduced. In this context, it is significant that the resistors R2 and R1 are selected to have a very high resistance. Through the use of the current sources I2, I1, it is achieved that the DC components in the output signal voltage SO, which reduce the level or magnitude of the respective amplitude limitation, are suppressed. Experiments and investigations conducted by the applicants have shown that the output of the differential amplifier D is only slightly loaded due to the negative or reverse feedback, especially through the use of the high-resistance resistors R2, R1, for example in a range near 1 kOhm. Since separate control lines are provided to the two current sources I2, I1, the amplitude limitation of the negative output signal and the amplitude limitation of the positive output signal are adjustable independently of each other. Furthermore, it is advantageous that the range of the possible amplitude limitation can be increased in a particularly simple fashion, for example by means of a series circuit of diodes or transistors between the emitter and the inverting input of the differential amplifier.

Figure 4:
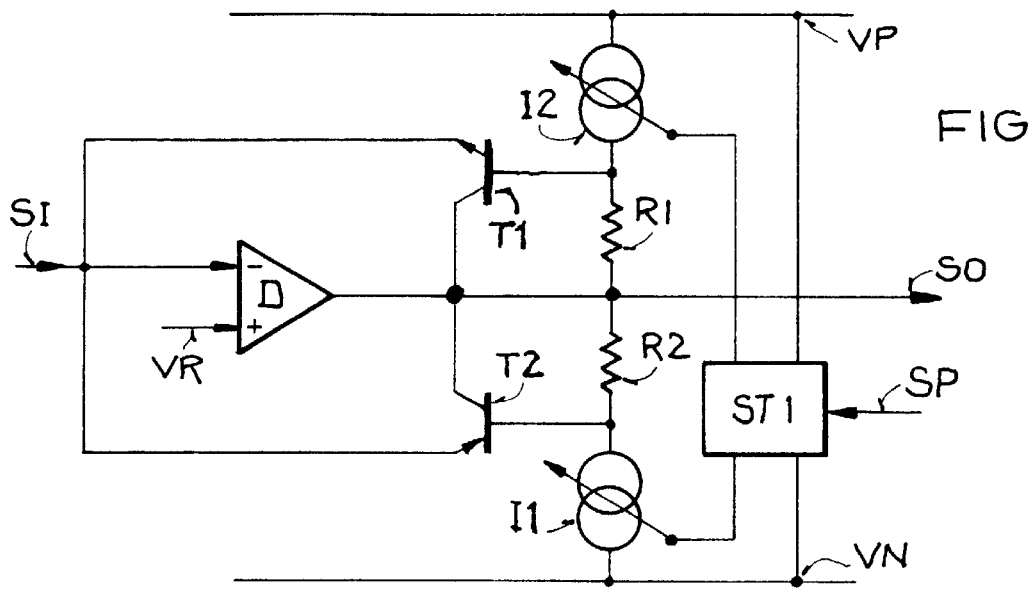
FIG. 4 schematically illustrates an alternative circuit arrangement for a "soft" amplitude limitation.

FIG. 4 schematically shows a varied embodiment of a circuit arrangement, of which the purpose is to achieve a soft limitation or soft clipping of the amplitude of the output signal above the adjusted or set threshold values. The following discussion should be regarded as a supplement to the basic discussion provided above in connection with FIG. 3, and only the differences between the arrangement of FIG. 4 and that of FIG. 3 will be discussed in detail here.

In order to achieve a soft amplitude limitation, the collectors of the two transistors T2, T1 are not connected with the supply voltages VN, VP as in FIG. 3, but instead are connected with the output of the differential amplifier D in this embodiment of FIG. 4. Due to the operating characteristic of the transistors, and the small voltage differences between the input signal SI and the output signal SO, the output above the adjusted positive threshold value, and below (i.e. more negative than) the adjusted negative threshold value will be evermore strongly negatively fed back, as the magnitude of the output signal SO increases. In other words, the amplitude of the output signal will be evermore strongly reduced in relation to the increasing extent to which the amplitude of the output signal ranges beyond the adjusted threshold value. Thereby, a soft clipping and a soft onset of the amplitude limitation is achieved. A further advantage is that no connection with the supply voltage is established through the introduction of the negative or reverse feedback. In this manner, with pulse-form input signals, an interspersal of voltage peaks onto the supply voltage will not take place, and an intercoupling to subsequent signal stages will not arise.

Figure 5:
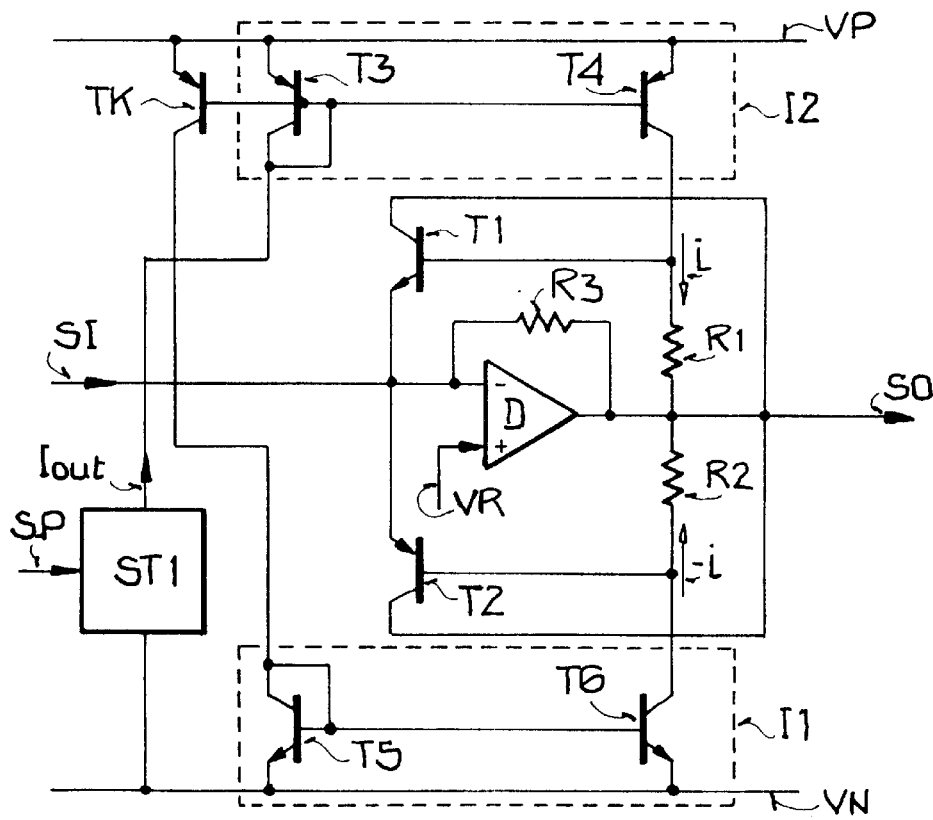
FIG. 5 schematically shows a further alternative circuit arrangement for symmetrically limiting the output signal amplitude in a soft-clipping manner.

The object of the further varied circuit arrangement that is schematically illustrated in FIG. 5 is to achieve a "soft" and symmetrical amplitude limitation of the output signal SO of the differential amplifier D. The present discussion of FIG. 5 should be understood as a supplement of the preceding discussion of FIG. 4, and only the differences or additional features of the present circuit arrangement will be described in detail here.

The adjustable current source I1 comprises a transistor T5 arranged as a diode with a base-collector interconnection and a transistor T6, which are connected as a current mirror circuit. Furthermore, the current source I2 comprises a transistor T3 arranged as a diode with a base-collector interconnection and a transistor T4, which are similarly connected as a current mirror circuit. Further in this regard, the transistors T6 and T4 are connected with the voltage divider resistors R2 and R1. Moreover, the two current mirrors are connected with each other by means of a coupling transistor TK, of which the base is connected to the (base-collector) cathode of the transistor diode T3. The emitter of the transistor diode T3 is connected with the positive supply voltage VP, and the collector thereof is connected with the control output of the control unit ST1 to receive the control signal Iout. Furthermore, the control unit ST1 thereby also applies the control current Iout to the base of the coupling transistor TK. Moreover, the output SO of the differential amplifier D is connected with the inverting input of the differential amplifier D through a feedback resistor R3.

The functional operation of the circuit according to FIG. 5 will now be described. By means of an externally provided or inputted programming signal SP, the magnitude or level of the control current Iout is prescribed by the control unit ST. The control current Iout controls the magnitude of the current i that is supplied or injected by the current mirror I2. The control current Iout is mirrored into the current mirror I1 by means of the coupling transistor TK, so that the current mirror I1 ultimately supplies or injects a current −i. Insofar as the two resistors R1 and R2 have the same resistance value, the two opposite currents i and −i will cause the same voltage drop. Thus, by means of the offset voltage, these two currents i and −i will establish a symmetrical and "soft" amplitude limitation in the two negative feedback branches of the differential amplifier D. Below, i.e. within, the adjusted or set amplitude thresholds, the amplification gain of the differential amplifier D is exclusively limited through the resistor R3. Since both branches of the negative feedback are constructed symmetrically, and the thresholds of the amplitude limitation are adjusted or set with a single control current Iout, the symmetry of the resulting amplitude limitation will not be influenced by the temperature or particularly temperature variations.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. An amplifier circuit including an inverting differential amplifier having an output signal with a limited amplitude, said circuit comprising:
   a differential amplifier having an inverting input, a non-inverting input, and an amplifier output;
   a first negative feedback branch adapted to limit a positive amplitude of an output signal of said amplifier output of said differential amplifier;
   a second negative feedback branch adapted to limit a negative amplitude of said output signal;
   a control unit having a control signal output and a programming signal input;
   a first supply voltage lead adapted to provide a first supply voltage; and
   a second supply voltage lead adapted to provide a second supply voltage;
   wherein:
      said first negative feedback branch includes a first threshold value switch that comprises a first adjustable current source, a first resistor, and a first transistor having a control terminal and two controlled terminals;
      said first adjustable current source and said first resistor are connected in series with each other between said first supply voltage lead and said amplifier output, and form a first voltage divider with a first voltage divider output between said first adjustable current source and said first resistor;
      said first voltage divider output is connected with said control terminal of said first transistor;
      one of said two controlled terminals of said first transistor is connected with said inverting input of said differential amplifier and another of said two controlled terminals of said first transistor is either connected with said first supply voltage lead or connected with said amplifier output of said differential amplifier;
      said first adjustable current source is connected with said control signal output of said control unit;
      said second negative feedback branch includes a second threshold value switch that comprises a second adjustable current source, a second resistor, and a second transistor having a control terminal and two controlled terminals;
      said second adjustable current source and said second resistor are connected in series with each other between said second supply voltage lead and said amplifier output, and form a second voltage divider with a second voltage divider output between said second adjustable current source and said second resistor;
      said second voltage divider output is connected with said control terminal of said second transistor;
      one of said two controlled terminals of said second transistor is connected with said inverting input of said differential amplifier and another of said two controlled terminals of said second transistor is either connected with said second supply voltage lead or connected with said amplifier output of said differential amplifier; and
      said second adjustable current source is connected with said control signal output of said control unit.

2. The amplifier circuit according to claim 1, wherein said another of said two controlled terminals of said first transistor is connected with said first supply voltage lead so that said first transistor selectively closes or opens a circuit path between said first supply voltage lead and said inverting input of said differential amplifier, and wherein said another of said two controlled terminals of said second transistor is connected with said second supply voltage lead so that said second transistor selectively closes or opens a circuit path between said second supply voltage lead and said inverting input of said differential amplifier.

3. The amplifier circuit according to claim 1, wherein said another of said two controlled terminals of said first transistor is connected with said amplifier output of said differential amplifier so that said first transistor selectively closes or opens a circuit path between said amplifier output and said inverting input of said differential amplifier, and wherein said another of said two controlled terminals of said second transistor is connected with said amplifier output of said differential amplifier so that said second transistor selectively closes or opens a circuit path between said amplifier output and said inverting input of said differential amplifier.

4. The amplifier circuit according to claim 1, further comprising an amplifier circuit input which is connected to said inverting input of said differential amplifier and to which an input signal is applied, and a voltage averaging element that is connected between said amplifier circuit input and said non-inverting input of said differential amplifier and that is adapted to provide to said non-inverting input a reference voltage corresponding to an average of a voltage of the input signal.

5. The amplifier circuit according to claim 1, wherein said first and second adjustable current sources are adjusted so that the amplitude of the output signal is limited to below 1 volt.

6. The amplifier circuit according to claim 1, wherein said first and second adjustable current sources are adjusted so that the positive amplitude and the negative amplitude of the output signal are symmetrically limited with respective positive and negative amplitude clipping levels that have the same magnitude.

7. The amplifier circuit according to claim 1, wherein said first and second adjustable current sources are adjusted so that the positive amplitude and the negative amplitude of the output signal are non-symmetrically limited with respective positive and negative amplitude clipping levels that have respective different magnitudes.

8. The amplifier circuit according to claim 1, wherein said first and said second transistors are respective bipolar transistors, said control terminals are base terminals of said bipolar transistors, and said two controlled terminals are emitter and collector terminals of said bipolar transistors.

9. The amplifier circuit according to claim 1, further comprising a coupling transistor having a control terminal and two controlled terminals, wherein said first adjustable current source comprises a first adjustable current mirror including an internal reference transistor, said second adjustable current source comprises a second adjustable current mirror, said control signal output of said control unit is connected with an input of said first adjustable current mirror, an output of said first adjustable current mirror is connected with said first voltage divider output which is connected with said control terminal of said first transistor, said internal reference transistor of said first adjustable current mirror is connected with said control terminal of said coupling transistor, and one of said controlled terminals of said coupling transistor is connected with an input of said second adjustable current mirror.

10. A method of limiting the positive and negative amplitudes of an output signal of a inverting differential amplifier using a control unit, a first threshold value switch connected to said differential amplifier in a first negative feedback loop, and a second threshold value switch connected to said differential amplifier in a second negative feedback loop, said method comprising the following steps:

a) limiting said negative amplitude of said output signal so as not to fall below a first negative threshold value, by means of said first threshold value switch;

b) limiting said positive amplitude of said output signal so as not to rise above a second positive threshold value, by means of said second threshold value switch; and c) adjusting said first negative threshold value and said second positive threshold value responsive to a control signal provided by said control unit.

11. The method according to claim 10, further comprising applying symmetrical negative and positive supply voltages with equal voltage magnitudes respectively to said first and second threshold value switches.

12. The method according to claim 10, wherein said first and second threshold value switches respectively comprise first and second controllable current sources, said step a) further comprises establishing said first negative threshold value by setting a first current magnitude flowing through said first controllable current source, said step b) further comprises establishing said second positive threshold value by setting a second current magnitude flowing through said second controllable current source, and said step c) comprises adjusting said first and second current magnitudes responsive to said control signal.

13. The method according to claim 12, wherein said first and second current magnitudes are independently adjustable relative to each other.

14. The method according to claim 13, wherein said first negative threshold value and said second positive threshold value are respectively set to have respective different magnitudes.

15. The method according to claim 13, wherein said first negative threshold value and said second positive threshold value are respectively set to have the same magnitude.

16. The method according to claim 12, wherein said first and second current magnitudes are symmetrically adjustable in common and in unison with each other.

17. The method according to claim 12, wherein said first and second controllable current sources respectively comprise first and second current mirrors, and said step c) comprises mutually controlling both of said current sources responsive to said control signal provided by said control unit by coupling an input signal of said first current mirror to an input of said second current mirror via a coupling transistor.

18. The method according to claim 10, further comprising generating a reference voltage by averaging an input voltage of an input signal being applied to an inverting input of said differential amplifier, and applying said reference voltage to a non-inverting input of said differential amplifier.

19. The method according to claim 10, further comprising carrying out said steps a) and b) to achieve a soft-clipping of said negative and positive amplitudes by reducing said negative and positive amplitudes of said output signal progressively more strongly the farther the magnitudes of said negative and positive amplitudes of said output signal exceed the magnitudes of said first negative threshold and said second positive threshold.

20. The method according to claim 10, wherein said steps a), b) and c) are carried out so that said first negative threshold value and said second positive threshold value each respectively have a magnitude of less than 1 volt.

* * * * *